United States Patent
Shimamoto et al.

(10) Patent No.: US 10,199,219 B2
(45) Date of Patent: Feb. 5, 2019

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Satoshi Shimamoto, Toyama (JP); Yoshiro Hirose, Toyama (JP); Hajime Karasawa, Toyama (JP); Ryota Horiike, Toyama (JP); Naoharu Nakaiso, Toyama (JP); Yoshitomo Hashimoto, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 0 days.

(21) Appl. No.: 15/620,280

(22) Filed: Jun. 12, 2017

(65) Prior Publication Data
US 2017/0365467 A1    Dec. 21, 2017

(30) Foreign Application Priority Data
Jun. 15, 2016 (JP) .................................. 2016-118468

(51) Int. Cl.
*H01L 21/02* (2006.01)
*C23C 16/455* (2006.01)
(Continued)

(52) U.S. Cl.
CPC .... *H01L 21/02645* (2013.01); *C23C 16/0272* (2013.01); *C23C 16/28* (2013.01);
(Continued)

(58) Field of Classification Search
CPC .......... H01L 21/02645; H01L 21/0245; H01L 21/02381; H01L 21/02532; H01L 21/0262;
(Continued)

(56) References Cited

U.S. PATENT DOCUMENTS 8,501,594 B2 * 8/2013 Huang .................... C30B 25/02
                                                    257/E21.09
9,048,327 B2 * 6/2015 Tanaka .............. H01L 21/02422
(Continued)

FOREIGN PATENT DOCUMENTS

JP    2013-197307 A    9/2013
JP    2014-060227 A    4/2014
(Continued)

*Primary Examiner* — Thanh T Nguyen
(74) *Attorney, Agent, or Firm* — Volpe and Koenig, P.C.

(57) ABSTRACT

There is provided a method of manufacturing a semiconductor device, which includes: forming a first seed layer containing silicon and germanium on a substrate by performing, a predetermined number of times, a cycle which includes supplying a first process gas containing silicon or germanium and containing a halogen element to the substrate, supplying a second process gas containing silicon and not containing a halogen element to the substrate, and supplying a third process gas containing germanium and not containing a halogen element to the substrate; and forming a germanium-containing film on the first seed layer by supplying a fourth process gas containing germanium and not containing a halogen element to the substrate.

13 Claims, 7 Drawing Sheets

(51) Int. Cl.
    *C23C 16/52*     (2006.01)
    *C23C 16/02*     (2006.01)
    *C23C 16/28*     (2006.01)

(52) U.S. Cl.
    CPC .. *C23C 16/45527* (2013.01); *C23C 16/45544* (2013.01); *C23C 16/45546* (2013.01); *C23C 16/52* (2013.01); *H01L 21/0245* (2013.01); *H01L 21/0262* (2013.01); *H01L 21/02381* (2013.01); *H01L 21/02532* (2013.01)

(58) Field of Classification Search
    CPC .............. C23C 16/28; C23C 16/45546; C23C 16/0272; C23C 16/45527; C23C 16/52; C23C 16/45544
    See application file for complete search history.

(56) References Cited

U.S. PATENT DOCUMENTS

| | | | |
|---|---|---|---|
| 2004/0009680 A1* | 1/2004 | Luo | H01L 21/2807 438/622 |
| 2013/0084693 A1* | 4/2013 | Kakimoto | C23C 16/24 438/482 |
| 2013/0149846 A1 | 6/2013 | Koshi et al. | |
| 2014/0080321 A1 | 3/2014 | Hirose et al. | |

FOREIGN PATENT DOCUMENTS

| | | |
|---|---|---|
| JP | 2014-067796 A | 4/2014 |
| WO | 2012/029661 A1 | 3/2012 |

\* cited by examiner

US 10,199,219 B2

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2016-118468, filed on Jun. 15, 2016, the entire contents of which are incorporated herein by reference.

TECHNICAL FIELD

The present disclosure relates to a method of manufacturing a semiconductor device, a substrate processing apparatus, and a recording medium.

BACKGROUND

As one of the processes for manufacturing a semiconductor device, a film forming process of forming a seed layer containing silicon (Si) on a substrate and subsequently forming a film containing Si on the seed layer.

However, if such a film forming technique is used in the case of forming a film containing germanium (Ge) instead of a film containing Si, a film quality may deteriorate in some cases.

SUMMARY

The present disclosure provides some embodiments of a technique capable of improving a film quality of a film formed on a substrate.

According to one embodiment of the present disclosure, there is provided a method of manufacturing a semiconductor device, which includes: forming a first seed layer containing silicon and germanium on a substrate by performing, a predetermined number of times, a cycle which includes supplying a first process gas containing silicon or germanium and containing a halogen element to the substrate, supplying a second process gas containing silicon and not containing a halogen element to the substrate, and supplying a third process gas containing germanium and not containing a halogen element to the substrate; and forming a germanium-containing film on the first seed layer by supplying a fourth process gas containing germanium and not containing a halogen element to the substrate.

DETAILED DESCRIPTION

One Embodiment of the Present Disclosure

One embodiment of the present disclosure will now be described in detail with reference to FIGS. 1 to 3.

(1) Configuration of Substrate Processing Apparatus

Figure 1:
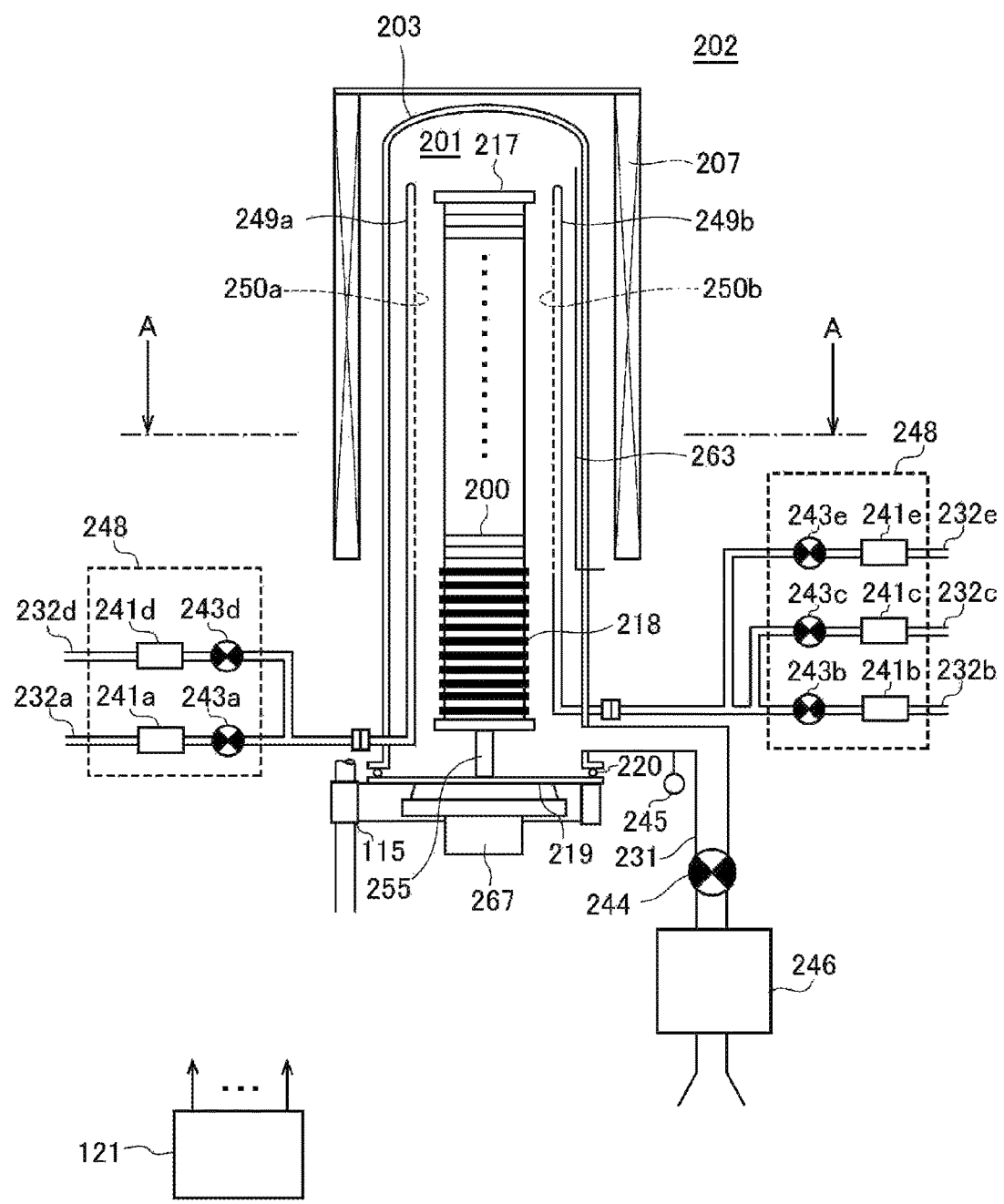
FIG. 1 is a schematic configuration diagram of a vertical type processing furnace of a substrate processing apparatus suitably used in one embodiment of the present disclosure, in which a portion of the processing furnace is shown in a vertical cross sectional view.

As illustrated in FIG. 1, a processing furnace 202 includes a heater 207 as a heating means (heating mechanism). The heater 207 has a cylindrical shape and is supported by a holding plate so as to be vertically installed. The heater 207 functions as an activation mechanism (an excitation part) configured to thermally activate (excite) a gas.

A reaction tube 203 that constitutes a reaction vessel (process vessel) is disposed inside the heater 207 in a concentric relationship with the heater 207. The reaction tube 203 is made of a heat resistant material such as, e.g., quartz ($SiO_2$), silicon carbide (SiC) or the like and is formed in a cylindrical shape with its upper end closed and its lower end opened. A process chamber 201 is formed in a hollow cylindrical portion of the reaction tube 203. The process chamber 201 is configured to be able to accommodate wafers 200 as substrates.

Inside the process chamber 201, nozzles 249a and 249b are installed so as to penetrate a lower side wall of the reaction tube 203. Gas supply pipes 232a and 232b are connected to the nozzles 249a and 249b, respectively. A gas supply pipe 232c is connected to the gas supply pipe 232b.

Mass flow controllers (MFCs) 241a to 241c as flow rate controllers (flow rate control parts) and valves 243a to 243c as on-off valves are respectively installed in the gas supply pipes 232a to 232c sequentially from respective upstream sides. Gas supply pipes 232d and 232e for supplying an inert gas are respectively connected to the gas supply pipes 232a and 232b at downstream sides of the valves 243a and 243b. MFCs 241d and 241e and valves 243d and 243e are respectively installed in the gas supply pipes 232d and 232e sequentially from respective upstream sides.

Figure 2:
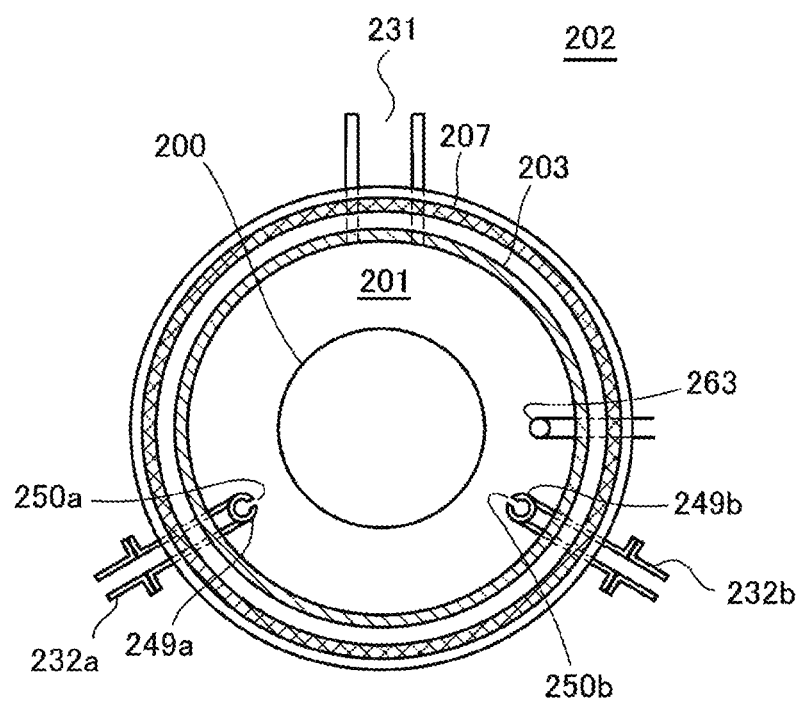
FIG. 2 is a schematic configuration diagram of the vertical type processing furnace of the substrate processing apparatus suitably used in one embodiment of the present disclosure, in which a portion of the processing furnace is shown in a cross sectional view taken along line A-A in FIG. 1.

As shown in FIG. 2, the nozzles 249a and 249b are installed in a space having an annular plan-view shape between the inner wall of the reaction tube 203 and the wafers 200 so as to extend upward in an arrangement direction of the wafers 200 from the lower portion of the inner wall of the reaction tube 203 to the upper portion thereof. In other words, the nozzles 249a and 249b are respectively installed at a lateral side of a wafer arrangement region in which the wafers 200 are arranged, in a region horizontally surrounding the wafer arrangement region, so as to extend along the wafer arrangement region. Gas supply holes 250a and 250b through which gases are supplied are formed in side surfaces of the nozzles 249a and 249b, respectively. The gas supply holes 250a and 250b are respectively opened so as to face the center of the reaction tube 20 so that the gas supply holes 250a and 250b can supply respective gases to the wafers 200. The gas supply holes 250a and 250b are installed in a plural number over a region spanning from the lower portion of the reaction tube 203 to the upper portion thereof.

From the gas supply pipe 232a, for example, a halogen-based precursor gas containing Si or Ge and containing a halogen element as a first process gas is supplied into the process chamber 201 via the MFC 241a, the valve 243a and the nozzle 249a. The precursor gas is a gas in a gaseous state, for example, a gas obtained by vaporizing a precursor remaining in a liquid state under room temperature and atmospheric pressure, a precursor remaining in a gaseous state under room temperature and atmospheric pressure, or the like. The halogen element includes chlorine (Cl), fluorine (F), bromine (Br), iodine (I), and the like. That is to say, the halogen-based precursor gas includes a halogen group such as a chloro group, a fluoro group, a bromo group, an iodine group, and the like. As the halogen-based precursor gas, it may be possible to use, for example, a halosilane precursor gas containing Si and Cl, namely a chlorosilane precursor gas, or a halogermane precursor gas containing Ge and Cl, namely a chlorogermane precursor gas. As the chlorosilane precursor gas, it may be possible to use, for example, a dichlorosilane ($SiH_2Cl_2$, abbreviation: DCS) gas. As the chlorogermane precursor gas, it may be possible to use, for example, a dichlorogermane ($GeH_2Cl_2$, abbreviation: DCG) gas.

From the gas supply pipe 232b, for example, a non-halogen-based silane precursor gas containing Si and not containing a halogen element as a second process gas is supplied into the process chamber 201 via the MFC 241b, the valve 243b and the nozzle 249b. As the second process gas, it may be possible to use a silicon hydride precursor gas, for example, a disilane ($Si_2H_6$, abbreviation: DS) gas.

From the gas supply pipe 232c, for example, a non-halogen-based germane precursor gas containing Ge and not containing a halogen element as a third process gas and a fourth process gas is supplied into the process chamber 201 via the MFC 241c, the valve 243c, the gas supply pipe 232b and the nozzle 249b. As the third process gas and the fourth process gas, it may be possible to use a germanium hydride precursor gas, for example, a monogermane ($GeH_4$, abbreviation: MG) gas.

From the gas supply pipes 232d and 232e, for example, a nitrogen ($N_2$) gas as an inert gas is supplied into the process chamber 201 via the MFCs 241d and 241e, the valves 243d and 243e, the gas supply pipes 232a and 232b, and the nozzles 249a and 249b, respectively.

A first supply system (a halosilane precursor supply system or a halogermane precursor supply system) is mainly configured by the gas supply pipe 232a, the MFC 241a and the valve 243a. A second supply system (a silicon hydride precursor supply system) is mainly configured by the gas supply pipe 232b, the MFC 241b and the valve 243b. A third supply system (germanium hydride precursor supply system) is mainly configured by the gas supply pipe 232c, the MFC 241c and the valve 243c. An inert gas supply system is mainly configured by the gas supply pipes 232d and 232e, the MFCs 241d and 241e, and the valves 243d and 243e.

One or all of the above-described various supply systems may be configured as an integrated supply system 248 in which the valves 243a to 243e, the MFCs 241a to 241e, and the like are integrated. The integrated supply system 248 is connected to the respective gas supply pipes 232a to 232e and is configured so that the operations of supplying various gases into the gas supply pipes 232a to 232e, namely the opening and closing operations of the valves 243a to 243e, the flow rate adjustment operations of the MFCs 241a to 241e, and the like, are controlled by a controller 121 which will be described later. The integrated supply system 248 is configured as integral type or divisional type integrated units and can be attached to and detached from the gas supply pipes 232a to 232e or the like on an integrated unit basis. The integrated supply system 248 is configured so that the maintenance, replacement and expansion of the supply systems can be performed on an integrated unit basis.

An exhaust pipe 231 for exhausting an internal atmosphere of the process chamber 201 is installed in the reaction tube 203. A vacuum pump 246 as a vacuum exhaust device is coupled to the exhaust pipe 231 via a pressure sensor 245 as a pressure detector (pressure detection part) for detecting an internal pressure of the process chamber 201 and an APC (Auto Pressure Controller) valve 244 as a pressure regulator (pressure regulation part). The APC valve 244 is configured so that the vacuum evacuation and vacuum evacuation stop of the interior of the process chamber 201 can be performed by opening and closing the APC valve 244 while operating the vacuum pump 246 and so that the internal pressure of the process chamber 201 can be regulated by adjusting the valve opening degree of the APC valve 244 based on the pressure information detected by the pressure sensor 245, while operating the vacuum pump 246. An exhaust system is mainly configured by the exhaust pipe 231, the APC valve 244 and the pressure sensor 245. The vacuum pump 246 may be included in the exhaust system.

A seal cap 219 as a furnace opening lid capable of air-tightly closing a lower end opening of the reaction tube 203 is installed below the reaction tube 203. The seal cap 219 is made of metal such as, e.g., SUS, and is formed in a disc shape. On an upper surface of the seal cap 219, there is installed an O-ring 220 as a seal member which is brought into contact with a lower end of the reaction tube 203. Below the seal cap 219, there is installed a rotation mechanism 267 configured to rotate a boat 217 to be described later. A rotary shaft 255 of the rotation mechanism 267 penetrates the seal cap 219 and is connected to the boat 217. The rotation mechanism 267 is configured to rotate the wafers 200 by rotating the boat 217. The seal cap 219 is configured to be moved up and down in the vertical direction by a boat elevator 115 as an elevating mechanism installed outside the reaction tube 203. The boat elevator 115 is configured as a conveying device (conveying mechanism) which loads and unloads (conveys) the boat 217, namely the wafers 200, into and out of the process chamber 201 by raising and lowering the seal cap 219.

The boat 217 serving as a substrate supporting part is configured to support a plurality of, e.g., 25 to 200, wafers 200, in such a state that the wafers 200 are arranged in a horizontal posture and in multiple stages along a vertical direction with the centers of the wafers 200 aligned with one another. That is to say, the boat 217 is configured to arrange the wafers 200 in a spaced-apart relationship. The boat 217 is made of a heat resistant material such as quartz or SiC. Heat insulating plates 218 made of a heat resistant material such as, e.g., quartz or SiC, are supported below the boat 217 in a horizontal posture and in multiple stages.

A temperature sensor 263 serving as a temperature detector is installed inside the reaction tube 203. Based on the temperature information detected by the temperature sensor 263, an amount of electric power supplied to the heater 207 is adjusted such that the interior of the process chamber 201 has a desired temperature distribution. The temperature sensor 263 is installed along the inner wall of the reaction tube 203.

Figure 3:
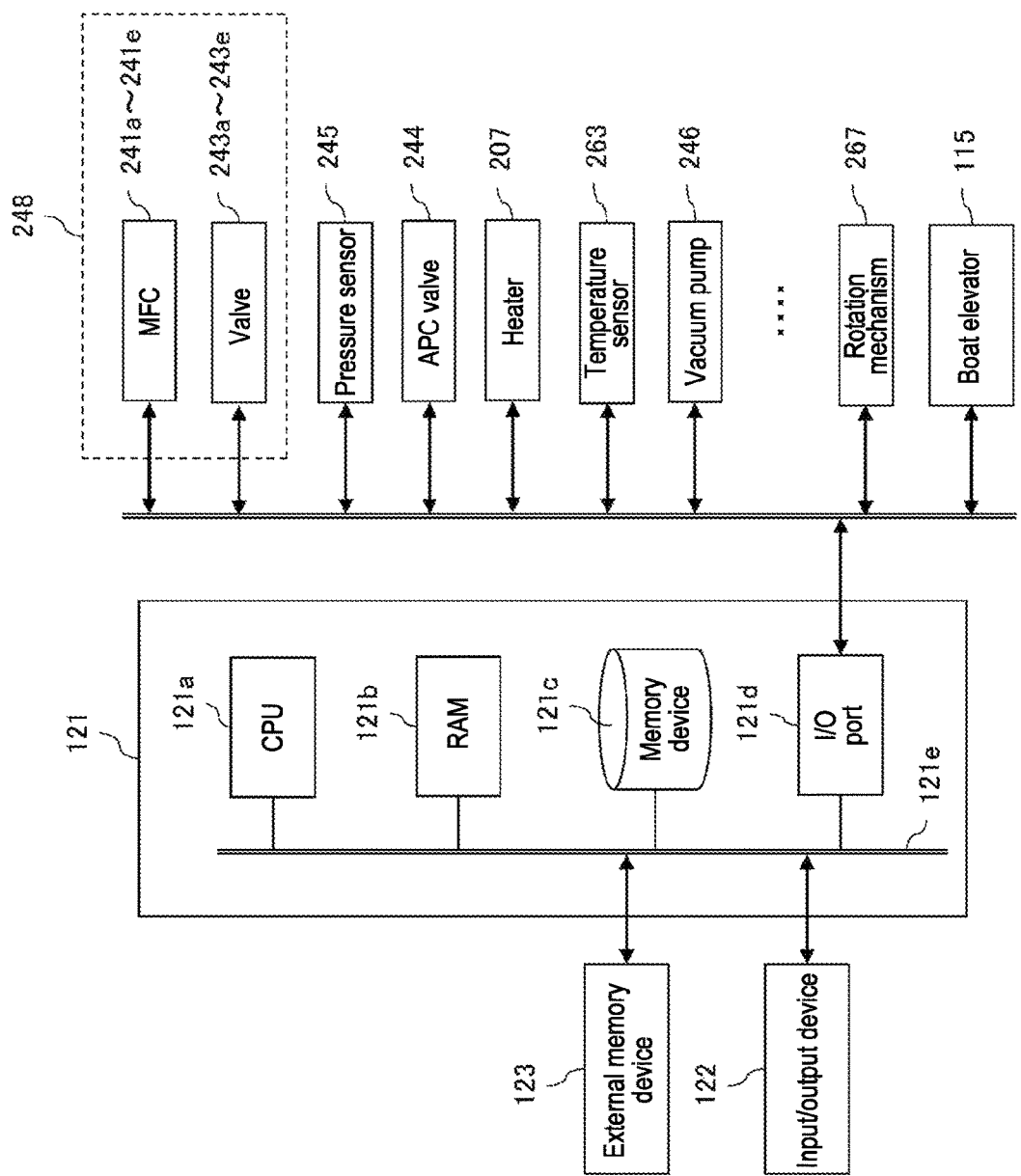
FIG. 3 is a schematic configuration diagram of a controller of the substrate processing apparatus suitably used in one embodiment of the present disclosure, in which a control system of the controller is shown in a block diagram.

As illustrated in FIG. 3, the controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e.

An input/output device 122 configured by, for example, a touch panel or the like, is connected to the controller 121.

The memory device 121c is configured by, for example, a flash memory, a hard disk drive (HDD), or the like. A control program for controlling operations of a substrate processing apparatus, a process recipe for specifying sequences and conditions of a substrate process to be described later, or the like is readably stored in the memory device 121c. The process recipe functions as a program for causing the controller 121 to execute each sequence in the substrate process (to be described later) to obtain a predetermined result. Hereinafter, the process recipe and the control program will be generally and simply referred to as a "program". Furthermore, the process recipe will be simply referred to as a "recipe". When the term "program" is used herein, it may indicate a case of including only the recipe, a case of including only the control program, or a case of including both the recipe and the control program. The RAM 121b is configured as a memory area (work area) in which a program or data read by the CPU 121a is temporarily stored.

The I/O port 121d is connected to the MFCs 241a to 241e, the valves 243a to 243e, the pressure sensor 245, the APC valve 244, the vacuum pump 246, the heater 207, the temperature sensor 263, the rotation mechanism 267, the boat elevator 115, and the like.

The CPU 121a is configured to read the control program from the memory device 121c and execute the same. The CPU 121a also reads the recipe from the memory device 121c according to an operation command input provided from the input/output device 122. In addition, the CPU 121a is configured to control, according to the contents of the recipe thus read, the flow rate adjusting operations of various kinds of gases by the MFCs 241a to 241e, the opening/closing operations of the valves 243a to 243e, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up and down with the boat elevator 115, and the like.

The controller 121 may be configured by installing, on the computer, the aforementioned program stored in an external memory device 123 (for example, a magnetic disc such as a hard disc or the like, an optical disc such as a CD or the like, a magneto-optical disc such as an MO or the like, or a semiconductor memory such as a USB memory or the like). The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using communication means such as the Internet or a dedicated line, instead of using the external memory device 123.

(2) Substrate Processing Steps

A sequence example of forming a germanium film (Ge film) on the wafer 200 as a substrate using the aforementioned substrate processing apparatus, which is one of the processes for manufacturing a semiconductor device, will be described below with reference to FIG. 4A. In the following descriptions, the operations of the respective parts constituting the substrate processing apparatus are controlled by the controller 121.

Figure 4A:
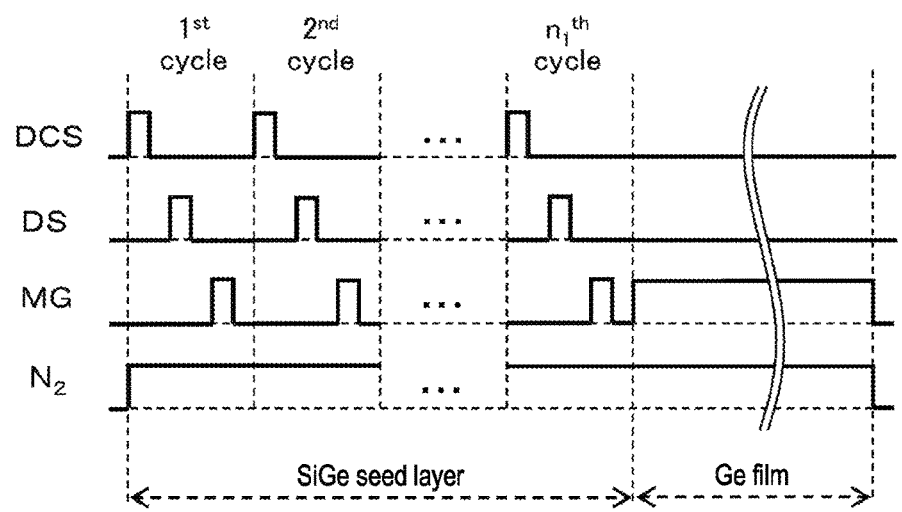
FIG. 4A is a diagram showing a film forming sequence according to one embodiment of the present disclosure.

In the film forming sequence shown in FIG. 4A, there are performed:

a step (SiGe seed layer forming step) of forming a SiGe seed layer as a first seed layer containing Si and Ge on the wafer 200 by performing, a predetermined number of times, a first cycle including step 1a of supplying a DCS gas to the wafer 200, step 2a of supplying a DS gas to the wafer 200 and step 3a of supplying an MG gas to the wafer 200; and a step (Ge film forming step) of forming a Ge film as a Ge-containing film on the SiGe seed layer by supplying the MG gas to the wafer 200.

In the present disclosure, the film forming sequence shown in FIG. 4A may be denoted as follows for the sake of convenience. Similar notations are also used in the following descriptions of modifications and the like.

(DCS→DS→MG)×$n_1$ →MG⇒ Ge film/SiGe seed

When the term "wafer" is used herein, it may refer to a wafer itself or a laminated body of a wafer and a predetermined layer or film formed on the surface of the wafer. When the phrase "a surface of a wafer" is used herein, it may refer to a surface of a wafer itself or a surface of a predetermined layer or the like formed on a wafer. In the present disclosure, the expression "a predetermined layer is formed on a wafer" may mean that a predetermined layer is directly formed on a surface of a wafer itself or that a predetermined layer is formed on a layer or the like formed on a wafer. When the term "substrate" is used herein, it may be synonymous with the term "wafer."

(Wafer Charging and Boat Loading)

The plurality of wafers 200 are charged into the boat 217 (wafer charging). Thereafter, as shown in FIG. 1, the boat 217 supporting the plurality of wafers 200 is lifted by the boat elevator 115 and is loaded into the process chamber 201 (wafer loading). In this state, the seal cap 219 seals the lower end of the reaction tube 203 via the O-ring 220.

As the wafer 200, for example, a Si substrate formed of monocrystalline Si or a substrate having a monocrystalline Si film formed on its surface may be used. The monocrystalline Si remains exposed on the surface of the wafer 200. An insulating film such as, e.g., a silicon oxide film (SiO film), a silicon nitride film (SiN film), a silicon oxynitride film (SiON film), or the like may be formed on a portion of the surface of the wafer 200.

Before the wafers 200 are loaded into the process chamber 201, the surface of each of the wafers 200 is cleaned beforehand with hydrogen fluoride (HF) or the like. However, after the cleaning process, the surface of each of the wafers 200 is temporarily exposed to the atmosphere until the wafers 200 are loaded into the process chamber 201. Therefore, a natural oxide film (SiO film) is formed on at least a portion of the surface of the wafer 200 loaded into the process chamber 201. The natural oxide film may be formed so as to sparsely (in an island shape) cover the surface of the wafer 200, namely a portion of the exposed monocrystalline Si, or may be formed so as to continuously (in a non-island shape) cover the entire region of the exposed monocrystalline Si.

(Pressure Regulation and Temperature Adjustment)

The interior of the process chamber 201, namely the space in which the wafers 200 are located, is vacuum-exhausted (depressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information. The vacuum pump 246 may be continuously activated at least until the process of the wafers 200 is completed. The wafers 200 in the process chamber 201 are heated by the heater 207 to a desired film formation temperature. In this operation, the state of supplying electric power to the heater 207 is feedback-controlled based on the temperature information detected by the temperature sensor 263 such that the interior of the process chamber 201 has a desired temperature distribution. In addition, the heating of the interior of the process chamber 201 by the heater 207 may be continuously performed at least until the process of the wafers 200 is completed. The rotation of the boat 217 and the wafers 200 by the rotation mechanism 267 begins. The rotation of the boat 217 and the wafers 200 may be continuously performed at least until the process of the wafers 200 is completed.

(SiGe Seed Layer Forming Step)

Thereafter, steps 1a to 3a are sequentially executed.

[Step 1a]

In this step, a DCS gas is supplied to the wafer 200. Specifically, the valve 243a is opened to allow the DCS gas to flow through the gas supply pipe 232a. A flow rate of the DCS gas is adjusted by the MFC 241a. The DCS gas is supplied into the process chamber 201 via the nozzle 249a and is exhausted from the exhaust pipe 231. At this time, the DCS gas is supplied to the wafer 200. At the same time, the valve 243d is opened to allow a $N_2$ gas to flow through the gas supply pipe 232d. The $N_2$ gas is supplied into the process chamber 201 together with the DCS gas and is exhausted from the exhaust pipe 231. In order to prevent the DCS gas from entering the nozzle 249b, the valve 243e is opened to allow the $N_2$ gas to flow through the gas supply pipe 232e. The $N_2$ gas is supplied into the process chamber 201 via the gas supply pipe 232b and the nozzle 249b and is exhausted from the exhaust pipe 231.

By supplying the DCS gas to the wafer 200, it is possible to generate a DCS-based treatment effect and to perform the following process. That is to say, by supplying DCS containing Cl having high electronegativity to the surface of the wafer 200, oxygen (O) in the natural oxide film formed on the surface of the wafer 200 and Cl in the DCS can be caused to meet with each other, thereby breaking a Si—O bond contained in the natural oxide film. In other words, the Si—O bond terminating at the surface of the monocrystalline Si can be broken by the polarity of DCS. In addition, the Si—O bond terminating at the surface of the monocrystalline Si can be broken by a small amount of $Cl^-$ (Cl ions) generated by the separation from DCS. As a result, a dangling bond of Si can be generated on the surface of the monocrystalline Si. This makes it possible to create an environment in which the epitaxial growth to be described later is easy to proceed. On the surface of the wafer 200, the above-described reaction proceeds, whereby the natural oxide film formed on the surface of the wafer 200 is removed so that the surface of the monocrystalline Si is exposed. In this manner, the DCS gas acts as a cleaning gas for removing the natural oxide film from the surface of the monocrystalline Si. In the case where a SiO film or the like is formed on the surface of the wafer 200, a Si adsorption site is formed on the surface of the SiO film or the like due to the above-described treatment effect.

After the environment where the epitaxial growth is easy to occur on the surface of the wafer 200 is established by the treatment effect described above, the valve 243a is closed to stop the supply of the DCS gas. At this time, while keeping the APC valve 244 opened, the interior of the process chamber 201 is evacuated such that the unreacted gas which is the remaining gas after the aforementioned reaction in the process chamber 201, is removed from the interior of the process chamber 201. At this time, the valves 243d and 243e are kept opened to maintain the supply of the $N_2$ gas into the process chamber 201. The $N_2$ gas acts as a purge gas.

[Step 2a]

After step 1a is completed, a DS gas is supplied to the wafer 200. In this step, controlling the opening and closing operations of the valves 243b, 243d and 243e is performed in the same procedure as controlling the opening and closing operations of the valves 243a, 243d and 243e in step 1a, whereby the DS gas is caused to flow into the gas supply pipe 232b. A flow rate of the DS gas flowing through the gas supply pipe 232b is adjusted by the MFC 241b. The DS gas is supplied into the process chamber 201 via the nozzle 249b and is exhausted from the exhaust pipe 231. At this time, the DS gas is supplied to the wafer 200.

By supplying the DS gas to the wafer 200, Si contained in the DS can be bonded to the dangling bond of Si formed in step 1a. As a result, nuclei of Si crystals (Si nuclei) can be formed on the surface of the wafer 200. Si crystals can be subjected to the epitaxial growth (gas-phase epitaxial growth). This growth is homoepitaxial growth. In the homoepitaxial growth, on the underlying crystals, crystals having the same lattice constant as the underlying crystals and made of the same material as the underlying crystals grow in the same crystal orientation as the underlying crystals. It is therefore possible to obtain less-defective high quality crystals. In the case where a SiO film or the like is formed on the surface of the wafer 200, Si contained in DS can be adsorbed onto the Si adsorption sites formed on the surface of the SiO film or the like by the aforementioned treatment effect. In this case, Si nuclei having an amorphous state, a polycrystalline state or a mixed crystal state in which an amorphous state and a polycrystalline state are mixed with each other, are formed on the SiO film.

After the formation of the Si nuclei is completed, the valve 243b is closed to stop the supply of the DS gas. Then, by the same process procedure as in step 1a, the unreacted gas, which is the remaining gas after the above reaction or the reaction byproduct remaining in the process chamber 201, is removed from the interior of the process chamber 201.

[Step 3a]

After step 2a is completed, an MG gas is supplied to the wafer 200. In this step, controlling the opening and closing operations of the valves 243c, 243d and 243e is performed in the same procedure as controlling the opening and closing operations of the valves 243a, 243d and 243e in step 1a so that the MG gas flows through the gas supply pipe 232c. A flow rate of the MG gas flowing through the gas supply pipe 232c is adjusted by the MFC 241c. The MG gas is supplied into the process chamber 201 via the gas supply pipe 232b and the nozzle 249b and is exhausted from the exhaust pipe 231. At this time, the MG gas is supplied to the wafer 200.

By supplying the MG gas to the wafer 200, Ge contained in MG can be bonded to the dangling bond of Si formed in step 1a or the dangling bond of Si constituting the Si nuclei formed in step 2a. As a result, nuclei of SiGe crystals (SiGe nuclei) can be formed on the surface of the wafer 200, and SiGe crystals can be caused to epitaxially grow in a gas phase. This growth is the heteroepitaxial growth. In the heteroepitaxial growth, crystals having the same crystal structure as the underlying crystals and made of a material different from the material of the underlying crystals grow in the same crystal orientation on the underlying crystals. In the case where an SiO film or the like is formed on the surface of the wafer 200, Ge contained in MG can be adsorbed to the Si adsorption site formed on the surface of the SiO film or the like, or the Si adsorption site of Si nuclei, by the treatment effect described above. In this case, SiGe nuclei in an amorphous state, a polycrystalline state or a mixed crystal state in which an amorphous state and a polycrystalline state are mixed with each other, are formed on the SiO film.

After the formation of the SiGe nuclei is completed, the valve 243c is closed to stop the supply of the MG gas. Then, by the same process procedure as in step 1a, the unreacted gas, which is the remaining gas after the aforementioned reaction, or the reaction byproduct remaining in the process chamber 201, is removed from the interior of the process chamber 201.

When steps 2a and 3a are performed, at least a portion of the surface of the wafer 200 may remain terminated with a Si—H bond contained in the DS gas or a Ge—H bond contained in the MG gas in some cases. The Si—H bond or the Ge—H bond terminating at the surface of the wafer 200 can be broken by supplying the DCS gas to the wafer 200 in the subsequent step 1a. That is to say, the Si—H bond or the Ge—H bond terminating at the surface of the wafer 200 can be broken by a small amount of Cl$^-$ generated by the separation from DCS. As a result, a dangling bond of Si or Ge can be formed on the surface of the wafer 200. In other words, on the surface of the wafer 200, an environment where the epitaxial growth is easy to occur can be established again. Thus, in the subsequent steps 2a and 3a, the formation of the Si nuclei or the SiGe nuclei described above is started without delay.

If steps 2a and 3a are performed, Si nuclei or SiGe nuclei may abnormally grow on the surface of the wafer 200 in some cases. For example, when steps 2a and 3a are performed, Si or Ge adsorbed onto the surface of the wafer 200 may locally agglomerate and a convex-concave structure may be formed on the surface of the wafer 200 in some cases. However, the abnormally grown nuclei can be removed by supplying the DCS gas to the wafer 200 in the subsequent step 1a. That is to say, a Si—Si bond, a Ge—Ge bond and a Si—Ge bond contained in the abnormally grown nuclei can be broken by a small amount of Cl$^-$ generated by the separation from DCS, thereby etching the abnormally grown nuclei. Thus, the surface of the layer formed in the SiGe seed layer forming step can be smoothened. As a result, it is possible to improve the surface roughness or the like of the finally formed Ge film. Here, the term "surface roughness" refers to a height difference (having the same meaning as that of surface coarseness) of a film in in-plane of the wafer. Further, the surface roughness may indicate that the surface becomes smoother as its value grows smaller. That is to say, the expression "the surface roughness is enhanced" refers to the fact that a difference in height of a film is reduced to enhance the smoothness of the surface.

Each of the effects described here may be considered to be included in the DCS-based treatment effect.

[Performing a Predetermined Number of Times]

A cycle of performing steps 1a to 3a in this order, i.e., non-simultaneously without synchronization, is performed a predetermined number of times ($n_1$ times where $n_1$ is an integer of 1 or more). As a result, a SiGe seed layer can be formed on the surface of the wafer 200. The SiGe seed layer is formed by epitaxially growing a SiGe crystal with the surface of the wafer 200 used as a base. The crystal structure of the SiGe seed layer is a monocrystal inheriting the crystallinity of the base. That is to say, the SiGe seed layer is a monocrystalline SiGe layer (epitaxial SiGe layer) having the same crystal orientation as the underlying monocrystalline Si.

Hereinafter, the process conditions of the SiGe seed layer forming step will be described. The conditions shown here are also conditions that enable the above-mentioned treatment effect to be exhibited properly.

The supply flow rates of the process gases (the DCS gas, the DS gas and the MG gas) in steps 1a to 3a are respectively set to predetermined flow rates within a range of, for example, 10 to 2,000 sccm. The supply time periods of the process gases in steps 1a to 3a are respectively set to predetermined time periods within a range of, for example, 1 to 60 minutes. In steps 1a to 3a, the supply flow rates of the $N_2$ gas supplied from the respective gas supply pipes are respectively set to predetermined flow rates within a range of, for example, 0 to 10,000 sccm. By not supplying the $N_2$ gas, it becomes possible to increase a partial pressure of each process gas and to improve the layer quality.

The temperature (film formation temperature) of the wafer 200 is set to a temperature within a range of, for example, 250 to 450 degrees C., specifically 300 to 400 degrees C. The internal pressure (film formation pressure) of the process chamber 201 is set to a pressure within a range of, for example, 0.1 to 10 Torr (13.3 to 1,330 Pa).

If the film formation temperature is less than 250 degrees C. or if the film formation pressure is less than 0.1 Torr, the amount of Cl$^-$ or DCS supplied to the wafer 200 in step 1a may be insufficient and the treatment effect described above may not be obtained in some cases. Furthermore, the DS and MG supplied to the wafer 200 in steps 2a and 3a may be less likely to be decomposed and the formation of the SiGe seed layer on the wafer 200 may be difficult in some cases. By setting the film formation temperature to 250 degrees C. or higher or by setting the film formation pressure to 0.1 Torr or more, it is possible to solve these problems and to form the SiGe seed layer at a practical rate. By setting the film formation temperature to 300 degrees C. or higher, it is possible to more reliably solve these problems and to further increase the formation rate of the SiGe seed layer.

If the film formation temperature exceeds 450 degrees C. or if the film formation pressure exceeds 10 Torr, in step 1a, Si contained in DCS may be deposited on the wafer 200 in some cases. In this case, Si is deposited before the natural oxide film is removed from the surface of the monocrystalline Si. The epitaxial growth does not proceed on the monocrystalline Si (on the natural oxide film). The finally obtained SiGe seed layer may become an amorphous layer or a polycrystalline layer in some cases. Furthermore, the treatment effect using the polarity of DCS or the like may not be obtained in some cases. In addition, an excessive gas phase reaction occurs in steps 2a and 3a. Thus, the thickness uniformity or the step coverage of the SiGe seed layer may be deteriorated in some cases. Moreover, the amount of particles generated inside the process chamber 201 may increase in some cases. These problems can be solved by setting the film formation temperature to 450 degrees C. or lower or by setting the film formation pressure to 10 Torr or lower. Thus, the SiGe seed layer can be made to become a layer with good in-plane film thickness uniformity or good step coverage. By setting the film formation temperature to 400 degrees C. or lower, it is possible to more reliably solve these problems and to further improve the quality of the SiGe seed layer.

The number of execution times of the cycle ($n_1$) is set to a predetermined number of times within a range of, for example, 5 to 20 times, specifically 10 to 15 times. Thus, the thickness of the SiGe seed layer to be formed in this way can be set to a predetermined thickness within a range of, for example, 10 to 40 Å (1 to 4 nm), specifically 20 to 30 Å (2 to 3 nm). Incidentally, by performing the cycle a plurality of times, it is possible to increase the density of the SiGe seed layer and to prevent the SiGe seed layer from growing in an island shape. As a result, the Ge film formed on the SiGe seed layer can be formed into a dense film with good surface roughness and less film breakage or the like.

As the first process gas, in addition to the DCS gas, it may be possible to use a chlorosilane precursor gas such as monochlorosilane ($SiH_3Cl$, abbreviation: MCS) gas, a trichlorosilane ($SiHCl_3$, abbreviation: TCS) gas, a tetrachlorosilane ($SiCl_4$, abbreviation: STC) gas, a hexachlorodisilane ($Si_2Cl_6$, abbreviation: HCDS) gas or the like, or a chlorogermane precursor gas such as a monochlorogermane ($GeH_3Cl$, abbreviation: MCG) gas, a DCG gas, a trichlorogermane ($GeHCl_3$, abbreviation: TCG) gas, a tetrachlorogermane ($GeCl_4$, abbreviation: GTC) gas, a hexachlorodigermane ($Ge_2Cl_6$, abbreviation: HCDG) gas or the like. In step 1a, in order to promote the above-described breakage reaction of a Si—O bond while suppressing the deposition of Si or Ge on the wafer 200, a precursor gas having a small number of Si or Ge contained in one molecule and having a large number of Cl contained in one molecule may be used as the first process gas. In step 1a, in order to properly suppress the treatment effect described above, a precursor gas having a small number of Cl contained in one molecule may be used.

As the second process gas, in addition to the DS gas, it may be possible to use a silicon hydride precursor gas such as a monosilane ($SiH_4$) gas, a trisilane ($Si_3H_8$) gas, a tetrasilane ($Si_4H_{10}$) gas, a pentasilane ($Si_5H_{12}$) gas, a hexasilane ($Si_6H_{14}$) gas or the like, namely a silane precursor gas containing no halogen element.

As the third process gas, in addition to the MG gas, it may be possible to use a germanium hydride precursor gas such as a digermane ($Ge_2H_6$) gas, a trigermane ($Ge_3H_8$) gas, a tetragermane ($Ge_4H_{10}$) gas, a pentagermane ($Ge_5H_{12}$) gas, a hexagermane ($Ge_6H_{14}$) gas or the like, namely a germane precursor gas containing no halogen element.

As the inert gas, in addition to the $N_2$ gas, it may be possible to use, for example, a rare gas such as an Ar gas, a He gas, a Ne gas, a Xe gas or the like.

(Ge Film Forming Step)

After the SiGe seed layer forming step is completed, the MG gas is supplied to the wafer 200. In this step, the MG gas is caused to flow through the gas supply pipe 232c by the same procedure as that of step 3a described above. The MG gas flowing through the gas supply pipe 232c is supplied into the process chamber 201 and is supplied to the wafer 200. Thereafter, the MG gas is exhausted from the exhaust pipe 231.

By supplying the MG gas to the wafer 200, a Ge crystal having the same crystal structure as the SiGe crystal can be caused to epitaxially grow in a gas phase on the SiGe seed layer, thereby forming a Ge film (epitaxial Ge film) made of monocrystalline Ge. This growth is the heteroepitaxial growth. Since the lattice constant of the SiGe crystal is closer to the lattice constant of the Ge crystal than the lattice constant of the Si crystal, in the heteroepitaxial growth using the SiGe seed layer as a base, it is possible to obtain a high-quality crystal having fewer defects than in the heteroepitaxial growth using the surface of the wafer 200 (monocrystalline Si) as a base. That is to say, in the present embodiment, the SiGe seed layer forming step is performed in advance before performing the Ge film forming step. Thus, it is possible to obtain a high-quality Ge film having smaller internal stresses and fewer defects than when the Ge film forming step is performed without performing the SiGe seed layer forming step.

The supply flow rate of the MG gas is set to a flow rate within a range of, for example, 10 to 2,000 sccm. The supply time period of the MG gas can be appropriately determined depending on the film thickness of the Ge film formed on the wafer 200 or the like and may be set to a time period within a range of, for example, 10 to 120 minutes. The supply flow rates of the $N_2$ gas supplied from the respective gas supply pipes are respectively set to predetermined flow rates within a range of, for example, 0 to 10,000 sccm. By not supplying the $N_2$ gas, it becomes possible to increase the partial pressure of the MG gas and to improve the film quality. The internal pressure (film formation pressure) of the process chamber 201 is set to a pressure within a range of, for example, 0.1 to 20 Torr (13.3 to 2,660 Pa). Other conditions are the same as the process conditions in the SiGe seed layer forming step.

As the fourth process gas, in addition to the MG gas, it may be possible to use various kinds of germanium hydride precursor gases mentioned above. From the viewpoint of suppressing the residual halogen element in the Ge film, a germanium hydride precursor gas not containing a halogen element may be used as the fourth process gas. From the viewpoint of improving the film thickness uniformity of the Ge film, a low-order germanium hydride precursor gas like the third process gas may be used as the fourth process gas. That is to say, a gas composed of the same substance as that constituting the third process gas (a gas having the same molecular structure as the third process gas) may be used as the fourth process gas. From the viewpoint of improving the deposition rate of the Ge film, a high reactive germane precursor gas containing a halogen element may be used as the fourth process gas.

As the inert gas, in addition to the $N_2$ gas, it may be possible to use various kinds of rare gases mentioned above.

(After-Purging and Atmospheric Pressure Restoration)

After the Ge film forming step is completed, a $N_2$ gas is supplied into the process chamber 201 from each of the gas supply pipes 232d and 232e and is exhausted from the exhaust pipe 231. The $N_2$ gas acts as a purge gas. Thus, the interior of the process chamber 201 is purged with the inert gas. The gas remaining in the process chamber 201 and the reaction byproduct are removed from the interior of the process chamber 201 (after-purging). Thereafter, the internal atmosphere of the process chamber 201 is replaced by an inert gas (inert gas replacement), and the internal pressure of the process chamber 201 is restored to the atmospheric pressure (atmospheric pressure restoration).

(Boat Unloading and Wafer Discharging)

The seal cap 219 is moved down by the boat elevator 115 and the lower end of the reaction tube 203 is opened. Then, the processed wafers 200 supported by the boat 217 are unloaded from the lower end of the reaction tube 203 to the outside of the reaction tube 203 (boat unloading). The processed wafers 200 are taken out from the boat 217 (wafer discharging).

(3) Effects According to the Present Embodiment

According to the present embodiment, one or more effects set forth below may be achieved.

(a) By forming the SiGe seed layer in advance on the wafer 200 before performing the Ge film forming step, it is possible to improve the quality of the epitaxial growth as compared with a case where the Ge film is directly formed on the wafer 200 without forming the SiGe seed layer. This is because the SiGe seed layer functions as a buffer layer that absorbs a lattice constant difference (lattice mismatch) between the Si crystal constituting the surface of the wafer 200 and the Ge crystal constituting the Ge film. As a result, it is possible to obtain a Ge film of good quality with reduced internal stresses or defects, thereby improving the performance of a finally obtained semiconductor device and enhancing the manufacturing yield thereof.

(b) By forming the SiGe seed layer in advance on the wafer 200 before performing the Ge film forming step, it is possible to enhance the adhesion at the bonding interface between the Ge film and the wafer 200 or to improve the state of the interface level as compared with a case where the Ge film is directly formed on the wafer 200 without forming the SiGe seed layer. This makes it possible to improve the performance of the finally obtained semiconductor device and to enhance the manufacturing yield thereof.

(c) In the SiGe seed layer forming step, it is possible to start the epitaxial growth on the surface of the wafer 200 without delay by the treatment effect exerted by the DCS. In addition, due to this treatment effect, the SiGe seed layer can be made into a continuous and dense layer having excellent step coverage and a planar surface. As a result, the finally formed Ge film can be made into a film having excellent step coverage, excellent in-plane film thickness uniformity and extremely good surface roughness.

(d) By forming the SiGe seed layer in advance on the wafer 200 before performing the Ge film forming step, even if a SiO film or the like is present on a portion of the surface of the wafer 200 (the base of the film formation) and even if the SiO film or the like is not completely removed due to the DCS-based treatment effect, it is possible to enable the SiGe seed layer to function as an oxidation block layer (diffusion suppressing layer) for suppressing the diffusion of O from the base to the Ge film. As a result, it is possible to suppress the oxidation of the finally formed Ge film.

(e) The above-described effects can be similarly obtained when a precursor gas containing a halogen element other than the DCS gas is used as the first process gas, when a silicon hydride precursor gas other than the DS gas is used as the second process gas, or when a germanium hydride precursor gas other than MG gas is used as the third process gas or the fourth process gas. In the case where a gas not containing a halogen element, such as a silicon hydride precursor gas, a germanium hydride precursor gas, an aminosilane precursor gas, an aminogermane precursor gas or the like, is used as the first process gas, the treatment effect described above is not obtained.

(4) Modifications

The film forming sequence according to the present embodiment is not limited to the above-described aspects and may be changed as in the following modifications.

(Modification 1)

As in the film forming sequences shown below, in the SiGe seed layer forming step, the supply timings of the respective process gases may be changed from the film forming sequence shown in FIG. 4A. The process procedures and process conditions of the respective steps may be the same as those of the respective steps of the film forming sequence shown in FIG. 4A except for the gas supply timings.

(DCS→MG→DS)×$n_1$→MG⇒ Ge film/SiGe seed
(DCS→DS+MG)×$n_1$→MG⇒ Ge film/SiGe seed

Even with these modifications, the same effects as those of the film forming sequence shown in FIG. 4A can be obtained. In each cycle, the film forming sequence for supplying gases in the order of DCS→DS→MG or in the order of DCS→DS+MG is more preferable than the film forming sequence for supplying gases in the order of DCS→MG→DS, in that it is easy to perform the reliable and high-quality epitaxial growth using the surface of the wafer 200 as a base.

(Modification 2)

Figure 4B:
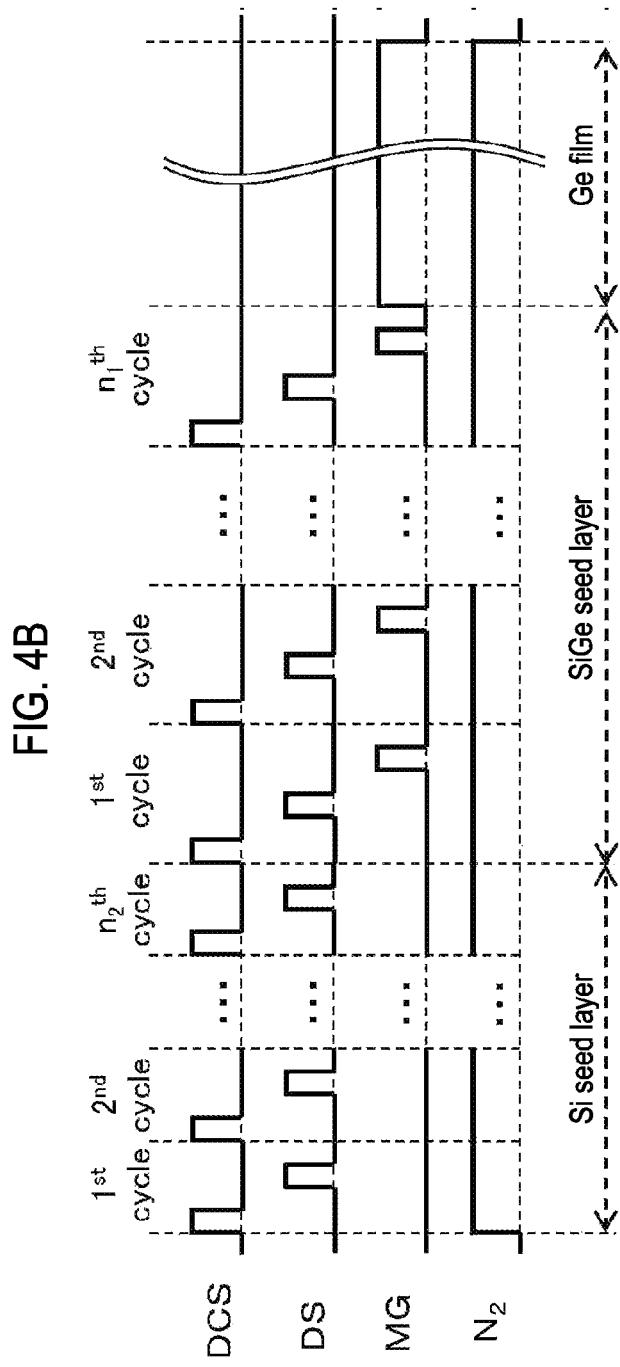
FIG. 4B is a diagram showing a modification.

As in the film forming sequence shown in FIG. 4B or the following film forming sequences, a Si seed layer forming step may be performed before performing the SiGe seed layer forming step. In the Si seed layer forming step, for example, a cycle which alternately performs step 1b of supplying a DCS gas to the wafer 200 and step 2b of supplying a DS gas to the wafer 200 is performed a predetermined number of times ($n_2$ times where $n_2$ is an integer of 1 or more), whereby a second seed layer (Si seed layer) containing Si is formed on the wafer 200. The Si seed layer is a monocrystalline Si layer (epitaxial Si layer). The process procedures and process conditions of steps 1b and 2b may be the same as those of steps 1a and 2a of the film forming sequence shown in FIG. 4A.

(DCS→DS)×$n_2$→(DCS→DS→MG)×$n_1$→MG⇒ Ge film/SiGe seed/Si seed
(DCS→DS)×$n_2$→(DCS→MG→DS)×$n_1$→MG⇒ Ge film/SiGe seed/Si seed
(DCS→DS)×$n_2$→(DCS→DS+MG)×$n_1$→MG⇒ Ge film/SiGe seed/Si seed Even with these modifications, the same effects as those of the film forming sequence shown in FIG. 4A can be obtained. In the Si seed layer forming step, similar to the SiGe seed layer forming step, due to the treatment effect exerted by the DCS, it is possible to start the epitaxial growth of the Si seed layer without delay over the entire surface of the wafer 200. Furthermore, due to this treatment effect, the Si seed layer can be made into a continuous and dense layer having the excellent step coverage and a planar surface. Thus, it is possible to further enhance the quality of the SiGe seed layer formed thereon. As a result, the finally formed Ge film can be made into a film having the excellent step coverage, the excellent in-plane film thickness uniformity and the better surface roughness.

(Modification 3)

As in the film forming sequences shown below, the Ge seed layer forming step may be performed after performing the SiGe seed layer forming step and before performing the Ge film forming step. In the Ge seed layer forming step, for example, a cycle which alternately performs step 1c of supplying a DCG gas to the wafer 200 and step 2c of supplying an MG gas to the wafer 200 is performed a predetermined number of times ($n_3$ times where $n_3$ is an integer of 1 or more), whereby a third seed layer (Ge seed layer) containing Ge is formed on the wafer 200. The Ge seed layer is a monocrystalline Ge layer (epitaxial Ge layer). The process procedures and process conditions of steps 1c and 2c may be the same as those of steps 1a and 3a of the film forming sequence shown in FIG. 4A, except that the DCG gas flows through the gas supply pipe 232a in step 1a.

(DCS→DS→MG)×$n_1$→(DCG→MG)×$n_3$→MG⇒ Ge film/Ge seed/SiGe seed
(DCS→MG→DS)×$n_1$→(DCG→MG)×$n_3$→MG⇒ Ge film/Ge seed/SiGe seed
(DCS→DS+MG)×$n_1$→(DCG→MG)×$n_3$→MG⇒ Ge film/Ge seed/SiGe seed Even with these modifications, the same effects as those of the film forming sequence shown in FIG. 4A can be obtained. In the Ge seed layer forming step, similar to the SiGe seed layer forming step, due to the treatment effect exerted by the DCG, it is possible to start the epitaxial growth of the Ge seed layer without delay over the entire surface of the wafer 200. Furthermore, due to this treatment effect, the Ge seed layer can be made into a continuous and dense layer having the excellent step coverage and a planar surface. Thus, it is possible to further enhance the quality of the Ge film formed thereon. As a result, the finally formed Ge film can be made into a film having the excellent step coverage, the excellent in-plane film thickness uniformity and the better surface roughness.

(Modification 4)

As in the film forming sequence shown below, before performing the Ge film forming step, a multilayered seed layer forming step which alternately repeats the aforementioned Si seed layer forming step and the aforementioned SiGe seed layer forming step a predetermined number of times ($m_1$ times where $m_1$ is an integer of 2 or more) may be performed. In the multilayered seed layer forming step, a multilayered seed layer in which Si seed layers and SiGe seed layers are alternately laminated is formed on the wafer 200. The multilayered seed layer serves as a base for forming a Ge film.

[(DCS→DS)×$n_2$→(DCS→DS→MG)×$n_1$]×$m_1$→MG
⇒ Ge film/multilayer seed

When performing the multilayered seed layer forming step, $n_2$ is made larger than $n_1$ ($n_2$>$n_1$) in the former-half period of the execution period of the multilayered seed layer forming step and $n_1$ is made larger than $n_2$ ($n_1$>$n_2$) in the latter-half period of the execution period of the multilayered seed layer forming step. That is to say, when the multilayered seed layer is grown, Si-rich crystals are grown in the lower layer portion of the multilayered seed layer (on the side closer to the wafer 200), and Ge-rich crystals are grown in the upper layer portion of the multilayered seed layer (on the side closer to the Ge film).

Even with this modification, the same effects as those of the film forming sequences shown in FIG. 4A and FIG. 4B can be obtained. Further, by changing (by applying gradation to) the composition of the multilayered seed layer over the thickness direction as described above, the lattice constant difference between the Si crystal constituting the surface of the wafer 200 and the Ge crystal constituting the Ge film can be more properly absorbed in the multilayered seed layer. As a result, it is possible to obtain a Ge film of better quality with smaller internal stresses and fewer defects.

(Modification 5)

Figure 5A:
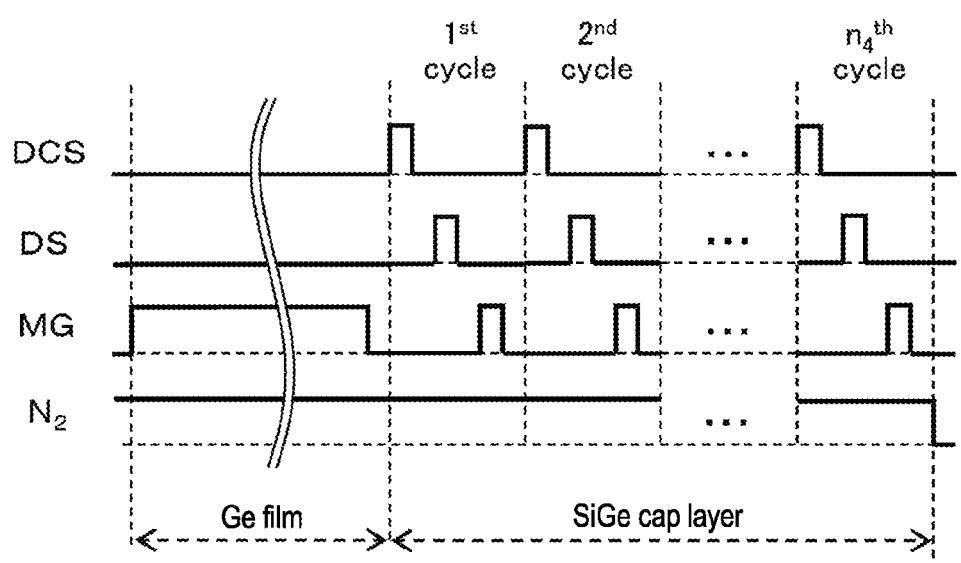
FIGS. 5A and 5B are diagrams showing modifications of the film forming sequence shown in FIG. 4A, respectively.

As in the film forming sequence shown in FIG. 5A or the following film forming sequences, a SiGe cap layer forming step may be performed after performing the Ge film forming step. In the SiGe cap layer forming step, for example, a cycle which includes step 1d of supplying a DCS gas to the wafer 200, step 2d of supplying a DS gas to the wafer 200, step 3d of supplying an MG gas to the wafer 200 is performed a predetermined number of times ($n_4$ times where $n_4$ is an integer of 1 or more), whereby a first cap layer (SiGe cap layer) containing Si and Ge is formed on the wafer 200. The SiGe cap layer is a monocrystalline SiGe layer (epitaxial SiGe layer). The process procedures and process conditions of the SiGe cap layer forming step may be the same as those of the SiGe seed layer forming step of the film forming sequence shown in FIG. 4A or the SiGe seed layer forming step of modification 1. In FIG. 5A, for the sake of convenience, the illustration of the SiGe seed layer forming step is omitted.

(DCS→DS→MG)×$n_1$→MG→(DCS→DS→MG)×$n_4$
⇒ SiGe cap/Ge film/SiGe seed (DCS→DS→MG)×$n_1$→MG→(DCS→MG→DS)×$n_4$
⇒ SiGe cap/Ge film/SiGe seed (DCS→DS→MG)×$n_1$→MG→(DCS→DS+MG)×$n_4$
⇒ SiGe cap/Ge film/SiGe seed Even with this modification, the same effects as those of the film forming sequence shown in FIG. 4A can be obtained. Ge is more easily oxidized than Si, and germanium oxide (GeO) has a property of being relatively easy to sublime. Therefore, the Ge film may be oxidized by a small amount of O component remaining in the process chamber 201, or may be oxidized when the wafer 200 subjected to the film forming process is exposed to the atmosphere. The surface state of the Ge film may be deteriorated. In contrast, if the SiGe cap layer made of SiGe having the higher oxidation resistance than Ge is formed on the Ge film as in the present embodiment, it is possible to suppress the oxidation of the surface of the Ge film and to stabilize (passivate) the surface of the Ge film. That is to say, it is possible to protect the surface state of the Ge film while maintaining the good state available immediately after the film formation.

(Modification 6)

Figure 5B:
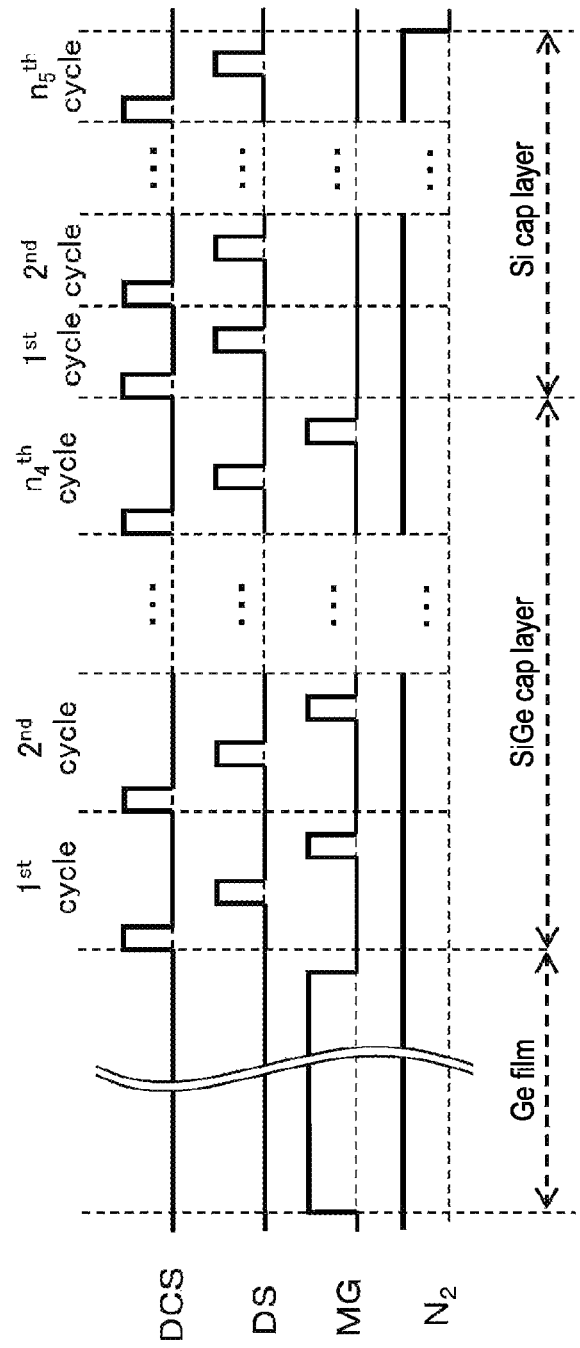

As in the film forming sequence shown in FIG. 5B or the following film forming sequences, a Si cap layer forming step may be performed after performing the SiGe cap layer forming step. Furthermore, after performing the Ge film forming step, the Si cap layer forming step may be performed without performing the SiGe cap layer forming step. In the Si cap layer forming step, for example, a cycle which includes step 1e of supplying a DCS gas to the wafer 200 and step 2e of supplying a DS gas to the wafer 200 is performed a predetermined number of times ($n_5$ times where $n_5$ is an integer of 1 or more), whereby a second cap layer (Si cap layer) containing Si is formed on the wafer 200 (on the SiGe cap layer or the Ge film). The Si cap layer is a monocrystalline Si layer (epitaxial Si layer). The process procedures and process conditions of steps 1e and 2e may be the same as those of steps 1a and 2a of the film forming sequence shown in FIG. 4A. In FIG. 5B, for the sake of convenience, the illustration of the SiGe seed layer forming step is omitted.

(DCS→DS→MG)×$n_1$→MG→(DCS→DS→MG)×$n_4$→(DCS→DS)×$n_5$ ⇒ Si cap/SiGe cap/Ge film/SiGe seed (DCS→DS→MG)×$n_1$→MG→(DCS→DS)×$n_5$ ⇒ Si cap/Ge film/SiGe seed Even with these modifications, the same effects as those of the film forming sequence shown in FIG. 4A can be obtained. Further, by forming the Si cap layer made of Si having the higher oxidation resistance than SiGe on the SiGe cap layer or the Ge film, it is possible to more reliably suppress the oxidation of the surface of the Ge film and to more reliably stabilize the surface of the Ge film.

(Modification 7)

As in the film forming sequence shown below, after performing the Ge film forming step, a multilayered cap layer forming step which alternately repeats the above-described SiGe cap layer forming step and the above-described Si cap layer forming step a predetermined number of times ($m_2$ times where $m_2$ is an integer of 2 or more) may be performed. In the multilayered cap layer forming step, a multilayered cap layer in which SiGe cap layers and Si cap layers are alternately laminated is formed on the wafer 200. The multilayered cap layer serves as a protective layer of the Ge film.

(DCS→DS→MG)×$n_1$→MG→[(DCS→DS→MG)×$n_4$→(DCS→DS)×$n_5$]×$m_2$ ⇒ multilayer cap/Ge film/SiGe seed layer When performing the multilayered cap layer forming step, $n_4$ is made larger than $n_5$ ($n_4$>$n_5$) in the former-half period of the execution period of the multilayered cap layer forming step, and $n_5$ is made larger than $n_4$ ($n_5$>$n_4$) in the latter-half period of the execution period of the multilayered cap layer forming step. That is to say, when the multilayered cap layer is grown, Ge-rich crystals are grown in the lower layer portion of the multilayered cap layer (on the side closer to the Ge film), and Si-rich crystals are grown in the upper layer portion of the multilayered cap layer (on the side of the surface).

Even with this modification, the same effects as those of the film forming sequence shown in FIG. 4A and those of modifications 5 and 6 can be obtained. Further, by changing (by applying gradation to) the composition of the multilayered cap layer over the thickness direction as described above, the lattice constant difference between the Ge crystal constituting the surface of the Ge film and the Si-rich crystal constituting the surface of the multilayered cap layer can be more properly absorbed in the multilayered cap layer. As a result, the multilayered cap layer can be made into an epitaxial layer with smaller internal stresses and fewer defects, and the function as a protective layer of the multilayered cap layer can be enhanced.

(Modification 8)

As in the film forming sequence shown below, at least one of the SiGe seed layer and the SiGe cap layer may be formed without using the DS gas. That is to say, the DCS gas may be used not only as a cleaning gas but also as a Si source.

(DCS→MG)×$n_1$→MG→(DCS→MG)×$n_4$ ⇒ SiGe cap/ Ge film/SiGe seed

Even with this modification, the same effects as those of the film forming sequence shown in FIG. 4A or those of the modifications described above can be obtained. Further, it is possible to simplify the configuration of the gas supply system and to reduce the cost of substrate process.

(Modification 9)

In the film formation sequence shown in FIG. 4A or the modifications described above, when forming various seed layers or various cap layers, by adjusting at least one of the process conditions such as the number of execution times of the cycle, the supply flow rates of the respective process gases, the supply time periods of the respective process gases, the internal pressure of the process chamber 201 and the like, the composition of the seed layer or the cap layer may be changed over the thickness direction (gradation may be applied to the composition of the seed layer or the cap layer). As a result, the same effects (the absorption of lattice constant difference) as those of modifications 4 and 7 can be obtained.

(Modification 10)

As the first process gas, as described above, a chlorosilane precursor gas other than the DCS gas may be used, or a chlorogermane precursor may be used. Furthermore, as the first process gas, in addition to these halogen-based precursor gases, it may be possible to use a halogen-based gas not containing Si or Ge, such as a hydrogen chloride (HCl) gas, a chlorine ($Cl_2$) gas, a boron chloride ($BCl_3$) gas, a chlorine fluoride ($ClF_3$) gas or the like. Even in this modification, the same effects can be obtained by setting various process conditions similarly to the process conditions of the film forming sequence shown in FIG. 4A.

(Modification 11)

As the second process gas, in addition to the above-described silicon hydride precursor gas, it may be possible to use an aminosilane precursor gas such as a butylaminosilane (BAS) gas, a bis-tertiary butyl aminosilane (BT-BAS) gas, a dimethylaminosilane (DMAS) gas, a bis-dimethylaminosilane (BDMAS) gas, a tris-dimethylaminosilane (3DMAS) gas, a diethylaminosilane (DEAS) gas, a bis-diethylaminosilane (BDEAS) gas, a dipropylaminosilane (DPAS) gas, a diisopropylaminosilane (DIPAS) gas or the like. Even in this modification, the same effects can be obtained by setting various process conditions similarly to the process conditions of the film forming sequence shown in FIG. 4A.

(Modification 12)

As the third process gas and the fourth process gas, in addition to the above-described germanium hydride precursor gas, it may be possible to use an aminogermane precursor gas such as a dimethyl aminogermane (DMAG) gas, a diethyl aminogermane (DEAG) gas, a bis-dimethyl aminogermane (BDMAG) gas, a bis-diethyl aminogermane (BDEAG) gas, a tris-dimethyl amino germane (3DMAG) gas or the like. Even in this modification, the same effects can be obtained by setting various process conditions similarly to the process conditions of the film forming sequence shown in FIG. 4A.

<Other Embodiments of the Present Disclosure>

The embodiments of the present disclosure have been specifically described above. However, the present disclosure is not limited to the above-described embodiments but may be diversely modified without departing from the spirit of the present disclosure.

The recipes used for the substrate process may be individually prepared according to the process contents and may be stored in the memory device 121c via an electric communication line or the external memory device 123. When starting the process, the CPU 121a may appropriately select a proper recipe from the recipes stored in the memory device 121c according to the contents of the substrate process. This configuration enables a single substrate processing apparatus to form films of different film types, composition ratios, film qualities and film thicknesses with high reproducibility. Moreover, it is possible to alleviate the burden borne by an operator and to quickly start the substrate process while avoiding any operation errors.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiments, there has been described the example in which films are formed using a batch-type substrate processing apparatus capable of processing a plurality of substrates at a time. The present disclosure is not limited to the aforementioned embodiments but may be appropriately applied to, e.g., a case where films are formed using a single-wafer-type substrate processing apparatus capable of processing a single substrate or several substrates at a time. In addition, in the aforementioned embodiments, there has been described an example in which films are formed using a substrate processing apparatus provided with a hot-wall-type processing furnace. The present disclosure is not limited to the aforementioned embodiments but may be appropriately applied to a case where films are formed using a substrate processing apparatus provided with a cold-wall-type processing furnace.

In the case of using these substrate processing apparatuses, film formation may be performed by the sequences and process conditions similar to those of the embodiments and modifications described above. Effects similar to those of the embodiments and modifications described above may be achieved.

By using the Ge film formed by the methods of the embodiments and modifications described above as a channel of a transistor, it is possible to greatly improve the mobility of electrons in the channel and to greatly enhance the electric characteristics.

The above-described embodiments and modifications may be combined as appropriate. The process conditions at this time may be, for example, process conditions similar to those of the above-described embodiments.

According to the present disclosure in some embodiments, it is possible to improve a film quality of a film formed on a substrate.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
    forming a first seed layer containing silicon and germanium on a substrate by performing, a predetermined number of times, a first cycle which includes supplying a first process gas containing silicon or germanium and containing a halogen element to the substrate, supplying a second process gas containing silicon and not containing a halogen element to the substrate, and supplying a third process gas containing germanium and not containing a halogen element to the substrate; and
    forming a germanium-containing film on the first seed layer by supplying a fourth process gas containing germanium and not containing a halogen element to the substrate.

2. The method of claim 1, wherein the first cycle includes performing the act of supplying the first process gas, the act of supplying the second process gas and the act of supplying the third process gas in this order.

3. The method of claim 1, wherein the first cycle includes performing the act of supplying the first process gas, the act of supplying the third process gas and the act of supplying the second process gas in this order.

4. The method of claim 1, wherein the first cycle includes alternately performing the act of supplying the first process gas and an act of simultaneously performing the act of supplying the second process gas and the act of supplying the third process gas.

5. The method of claim 1, further comprising:
    forming a second seed layer containing silicon on the substrate by performing, a predetermined number of times, a second cycle which includes the act of supplying the first process gas and the act of supplying the second process gas, wherein the act of forming the second seed layer and the act of forming the first seed layer are performed before performing the act of forming the germanium-containing film.

6. The method of claim 5, wherein the second cycle includes alternately performing the act of supplying the first process gas and the act of supplying the second process gas.

7. The method of claim 1, further comprising:
    forming a third seed layer containing germanium on the first seed layer by performing, a predetermined number of times, a third cycle which includes the act of supplying the first process gas and the act of supplying the third process gas, wherein the act of forming the third seed layer is performed after performing the act of forming the first seed layer and before performing the act of forming the germanium-containing film.

8. The method of claim 7, wherein the third cycle includes alternately performing the act of supplying the first process gas and the act of supplying the third process gas.

9. The method of claim 5, wherein before performing the act of forming the germanium-containing film, alternately repeating the act of forming the second seed layer and the act of forming the first seed layer is performed,
    in a former-half period of an execution period of the act of alternately repeating, a number of execution times of the second cycle is made larger than a number of execution times of the first cycle, and
    in a latter-half period of the execution period of the act of alternately repeating, the number of execution times of the first cycle is made larger than the number of execution times of the second cycle.

10. The method of claim 1, further comprising:
    forming a first cap layer containing silicon and germanium on the germanium-containing film by performing, a predetermined number of times, a fourth cycle which includes the act of supplying the first process gas, the act of supplying the second process gas and the act of supplying the third process gas.

11. The method of claim 10, further comprising:
    forming a second cap layer containing silicon on the first cap layer by performing, a predetermined number of times, a fifth cycle which includes the act of supplying the first process gas and the act of supplying the second process gas.

12. The method of claim 11, wherein after performing the act of forming the germanium-containing film, alternately repeating the act of forming the first cap layer and the act of forming the second cap layer is performed,
    in a former-half period of an execution period of the act of alternately repeating, a number of execution times of the fourth cycle is made larger than a number of execution times of the fifth cycle, and
    in a latter-half period of an execution period of the act of alternately repeating, the number of execution times of the fifth cycle is made larger than the number of execution times of the fourth cycle.

13. The method of claim 1, wherein the fourth process gas has the same molecular structure as the third process gas.

* * * * *